United States Patent
Hsieh

(10) Patent No.: US 11,075,082 B2
(45) Date of Patent: *Jul. 27, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Chih-Hung Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 36 days.

This patent is subject to a terminal disclaimer.

(21) Appl. No.: 16/222,641

(22) Filed: Dec. 17, 2018

(65) Prior Publication Data
US 2019/0139775 A1    May 9, 2019

Related U.S. Application Data

(60) Continuation of application No. 15/428,798, filed on Feb. 9, 2017, now Pat. No. 10,157,746, which is a
(Continued)

(51) Int. Cl.
*H01L 21/28*       (2006.01)
*H01L 21/3213*    (2006.01)
(Continued)

(52) U.S. Cl.
CPC .. *H01L 21/28123* (2013.01); *H01L 21/32133* (2013.01); *H01L 21/32139* (2013.01);
(Continued)

(58) Field of Classification Search
CPC ..... H01L 21/823431; H01L 21/823437; H01L 21/823481; H01L 21/823821;
(Continued)

(56) References Cited

U.S. PATENT DOCUMENTS 8,859,363 B2    10/2014    Kim et al.
8,916,460 B1 *   12/2014    Kwon ................. H01L 27/1211
                                                                438/595

(Continued)

FOREIGN PATENT DOCUMENTS

CN        103177950 A     6/2013
KR    10-2014-0111577 A    9/2014

OTHER PUBLICATIONS

Franssila S., Sainiemi L. (2008) Reactive Ion Etching (RIE). In: Li D. (eds) Encyclopedia of Microfluidics and Nanofluidics. Springer, Boston, MA. https://doi.org/10.1007/978-0-387-48998-8_1344 (Year: 2008).*

(Continued)

*Primary Examiner* — Mary A Wilczewski
(74) *Attorney, Agent, or Firm* — McDermott Will & Emery LLP

(57) ABSTRACT

A semiconductor device includes first and second FETs including first and second channel regions, respectively. The first and second FETs include first and second gate structures, respectively. The first and second gate structures include first and second gate dielectric layers formed over the first and second channel regions and first and second gate electrode layers formed over the first and second gate dielectric layers. The first and second gate structures are aligned along a first direction. The first gate structure and the second gate structure are separated by a separation plug made of an insulating material. The first gate electrode layer is in contact with a side wall of the separation plug.

20 Claims, 13 Drawing Sheets

Related U.S. Application Data division of application No. 14/928,214, filed on Oct. 30, 2015, now Pat. No. 9,601,567.

(51) Int. Cl.
| | |
|---|---|
| *H01L 21/8234* | (2006.01) |
| *H01L 27/088* | (2006.01) |
| *H01L 29/06* | (2006.01) |
| *H01L 29/423* | (2006.01) |
| *H01L 29/78* | (2006.01) |
| *H01L 29/66* | (2006.01) |
| *H01L 27/12* | (2006.01) |
| *H01L 21/8238* | (2006.01) |
| *H01L 27/092* | (2006.01) |
| *H01L 21/84* | (2006.01) |

(52) U.S. Cl.
CPC ........ *H01L 21/823431* (2013.01); *H01L 21/823437* (2013.01); *H01L 21/823481* (2013.01); *H01L 27/0886* (2013.01); *H01L 29/0653* (2013.01); *H01L 29/4238* (2013.01); *H01L 29/66545* (2013.01); *H01L 29/785* (2013.01); *H01L 21/823821* (2013.01); *H01L 21/845* (2013.01); *H01L 27/0924* (2013.01); *H01L 27/1211* (2013.01)

(58) Field of Classification Search
CPC ..... H01L 21/823828; H01L 21/823878; H01L 27/0886; H01L 27/0924; H01L 27/1211; H01L 29/66545; H01L 29/785; H01L 21/823468; H01L 21/823864; H01L 21/7856; H01L 21/7855; H01L 21/7858; H01L 21/823475; H01L 21/845; H01L 29/66795; H01L 29/7831; H01L 29/7846; H01L 29/7855; H01L 29/7856; H01L 2029/7858; H01L 29/41791; H01L 29/0649; H01L 29/4238; H01L 29/0653; H01L 21/32133; H01L 21/32139; H01L 21/28123; H01L 2924/13067

See application file for complete search history.

(56) References Cited

U.S. PATENT DOCUMENTS

| | | | |
|---|---|---|---|
| 9,214,358 B1* | 12/2015 | Lin | H01L 21/28035 |
| 9,331,074 B1* | 5/2016 | Chang | H01L 29/4966 |
| 9,502,567 B2 | 11/2016 | Chang et al. | |
| 9,508,727 B2 | 11/2016 | Park et al. | |
| 9,520,482 B1 | 12/2016 | Chang et al. | |
| 9,559,100 B2* | 1/2017 | Chang | H01L 21/32139 |
| 9,559,205 B2 | 1/2017 | Chang et al. | |
| 9,601,567 B1 | 3/2017 | Hsieh | |
| 9,608,065 B1* | 3/2017 | Bergendahl | H01L 27/0886 |
| 9,711,503 B2 | 7/2017 | Xie et al. | |
| 9,716,158 B1* | 7/2017 | Cheng | H01L 29/0847 |
| 9,741,717 B1 | 8/2017 | Cheng et al. | |
| 9,761,500 B2 | 9/2017 | Basker et al. | |
| 9,773,912 B2* | 9/2017 | Chang | H01L 29/66545 |
| 9,806,075 B2 | 10/2017 | Song et al. | |
| 9,837,510 B2 | 12/2017 | Chang et al. | |
| 9,876,013 B1 | 1/2018 | Park et al. | |
| 9,899,267 B1 | 2/2018 | Liou et al. | |
| 9,899,271 B2 | 2/2018 | Chang et al. | |
| 9,911,736 B1 | 3/2018 | Zang et al. | |
| 9,911,833 B2 | 3/2018 | Zhou | |
| 9,917,085 B2* | 3/2018 | Lin | H01L 21/823431 |
| 9,929,242 B2* | 3/2018 | Chang | H01L 29/0653 |
| 9,935,103 B2* | 4/2018 | Chang | H01L 21/823864 |
| 10,037,912 B2* | 7/2018 | Hsiao | H01L 21/76802 |
| 10,038,079 B1* | 7/2018 | Ohtou | H01L 29/66545 |
| 10,157,746 B2* | 12/2018 | Hsieh | H01L 21/32139 |
| 10,163,640 B1* | 12/2018 | Hsieh | H01L 21/28123 |
| 10,164,034 B2* | 12/2018 | Huang | H01L 27/0886 |
| 10,269,802 B2* | 4/2019 | Lin | H01L 27/0886 |
| 10,340,348 B2* | 7/2019 | Huang | H01L 29/401 |
| 10,516,033 B2* | 12/2019 | Yu | H01L 21/823481 |
| 10,607,896 B2* | 3/2020 | Ragnarsson | H01L 21/823821 |
| 10,707,325 B1* | 7/2020 | Cheng | H01L 29/66484 |
| 2007/0057325 A1 | 3/2007 | Hsu et al. | |
| 2010/0304555 A1 | 12/2010 | Kaneko et al. | |
| 2011/0291166 A1 | 12/2011 | Booth, Jr. et al. | |
| 2013/0164924 A1 | 6/2013 | Shieh et al. | |
| 2013/0181264 A1 | 7/2013 | Liao et al. | |
| 2013/0309837 A1 | 11/2013 | Chang et al. | |
| 2014/0199597 A1 | 7/2014 | Ni et al. | |
| 2014/0235393 A1* | 8/2014 | Sakanaka | F16G 5/166 474/263 |
| 2014/0252486 A1 | 9/2014 | Lin et al. | |
| 2014/0319623 A1 | 10/2014 | Tsai et al. | |
| 2014/0327046 A1* | 11/2014 | Huang | H01L 29/785 257/192 |
| 2015/0097250 A1 | 4/2015 | Cheon et al. | |
| 2015/0108544 A1* | 4/2015 | Ching | H01L 21/02532 257/192 |
| 2015/0115334 A1 | 4/2015 | Liaw | |
| 2015/0228647 A1* | 8/2015 | Chang | H01L 21/823431 257/401 |
| 2015/0325482 A1* | 11/2015 | Hu | H01L 21/308 257/401 |
| 2015/0348966 A1* | 12/2015 | Zhao | H01L 21/02326 257/401 |
| 2016/0064380 A1* | 3/2016 | Kwon | H01L 29/42364 257/401 |
| 2016/0133624 A1* | 5/2016 | Liao | H01L 21/823481 257/334 |
| 2016/0133632 A1 | 5/2016 | Park et al. | |
| 2016/0181399 A1 | 6/2016 | Jun et al. | |
| 2016/0181425 A1* | 6/2016 | Bai | H01L 29/7848 438/283 |
| 2016/0204215 A1* | 7/2016 | Chang | H01L 21/823821 257/401 |
| 2016/0225764 A1 | 8/2016 | Chang et al. | |
| 2016/0247730 A1* | 8/2016 | You | H01L 21/823481 |
| 2016/0268392 A1* | 9/2016 | Zhu | H01L 29/0649 |
| 2016/0300948 A1 | 10/2016 | Yang et al. | |
| 2016/0336320 A1* | 11/2016 | Lin | H01L 29/495 |
| 2017/0047257 A1 | 2/2017 | Han | H01L 27/0886 |
| 2017/0110454 A1* | 4/2017 | Chang | H01L 21/823878 |
| 2017/0117192 A1* | 4/2017 | Min | H01L 21/82385 |
| 2017/0154779 A1 | 6/2017 | Hsieh | |
| 2017/0194211 A1* | 7/2017 | Lai | H01L 21/76897 |
| 2017/0213830 A1* | 7/2017 | Ching | H01L 21/02356 |
| 2017/0345820 A1* | 11/2017 | Lin | H01L 29/66818 |
| 2017/0358575 A1* | 12/2017 | Cheng | H01L 29/0649 |
| 2018/0138174 A1* | 5/2018 | Min | H01L 21/31111 |
| 2018/0151564 A1* | 5/2018 | Lee | H01L 29/66545 |
| 2018/0204836 A1* | 7/2018 | Lin | H01L 21/823437 |
| 2019/0139775 A1* | 5/2019 | Hsieh | H01L 21/823481 |
| 2019/0221431 A1* | 7/2019 | Hsieh | H01L 29/785 |
| 2020/0273709 A1* | 8/2020 | Hsieh | H01L 21/823431 |

OTHER PUBLICATIONS

Notice of Allowance U.S. Appl. No. 14/928,214 dated Nov. 7, 2016.
Office Action Korean Patent Application No. 10-2016-0022691 dated Mar. 27, 2017.

* cited by examiner

SEMICONDUCTOR DEVICE AND MANUFACTURING METHOD THEREOF

CROSS REFERENCE TO RELATED APPLICATIONS

This Application is a Continuation of U.S. Ser. No. 15/428,798 filed Feb. 9, 2017, which is a Divisional Application of U.S. Ser. No. 14/928,214 filed Oct. 30, 2015, the subject matter of which is incorporated herein by reference in entirety.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-9E show cross sectional and/or plan views of exemplary sequential processes of manufacturing the Fin FET device according to one embodiment of the present disclosure. It is understood that additional operations can be provided before, during, and after processes shown by FIGS. 1-9E, and some of the operations described below can be replaced or eliminated, for additional embodiments of the method. The order of the operations/processes may be interchangeable.

Figure 1:
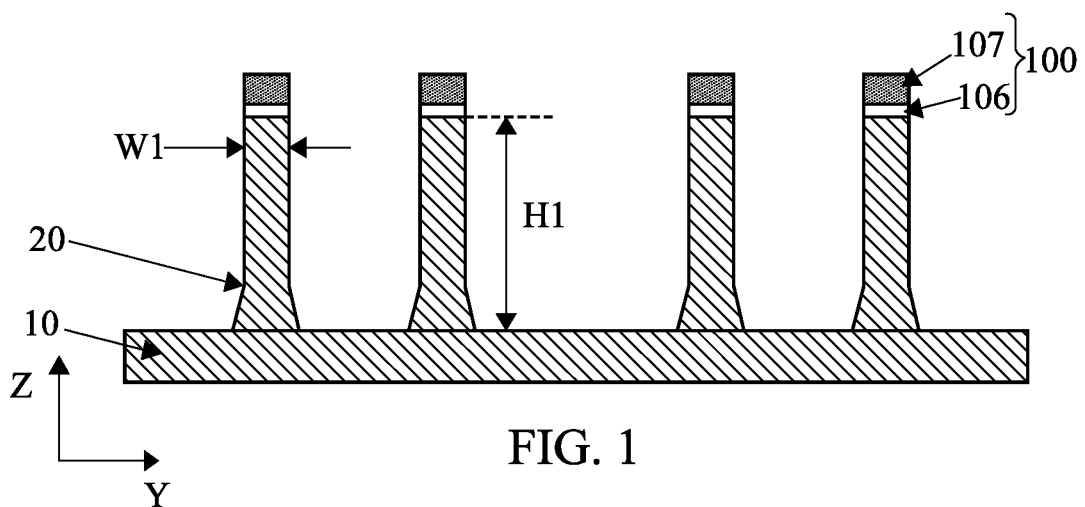
FIGS. 1-9E show exemplary sequential processes for manufacturing an FET device according to one embodiment of the present disclosure.

FIG. 1 shows an exemplary cross sectional view in which fin structures 20 are formed over a substrate 10. To fabricate a fin structure, a mask layer is formed over the substrate (e.g., a semiconductor wafer) by, for example, a thermal oxidation process and/or a chemical vapor deposition (CVD) process. The substrate is, for example, a p-type silicon substrate with an impurity concentration being in a range from about $1\times10^{15}$ cm$^{-3}$ and about $5\times10^{15}$ cm$^{-3}$. In other embodiments, The substrate is an n-type silicon substrate with an impurity concentration being in a range from about $1\times10^{15}$ cm$^{-3}$ and about $5\times10^{15}$ cm$^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer includes, for example, a pad oxide (e.g., silicon oxide) layer and a silicon nitride mask layer in some embodiments. The pad oxide layer may be formed by using thermal oxidation or a CVD process. The silicon nitride mask layer may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a photo resist pattern formed by photo lithography.

By using the mask pattern as an etching mask, a hard mask pattern 100 of the pad oxide layer 106 and the silicon nitride mask layer 107 is formed.

By using the hard mask pattern as an etching mask, the substrate is patterned into fin structures 20 by trench etching using a dry etching method and/or a wet etching method.

The fin structures 20 disposed over the substrate 10 are made of the same material as the substrate 10 and continuously extend from the substrate 10 in one embodiment. The fin structures 20 may be intrinsic, or appropriately doped with an n-type impurity or a p-type impurity.

In FIG. 1, four fin structures 20 are disposed. These fin structures are used for a p-type Fin FET and/or an n-type Fin FET. The number of the fin structures is not limited to four. The numbers may be as small as one, or more than four. In addition, one of more dummy fin structures may be disposed adjacent both sides of the fin structures 20 to improve pattern fidelity in patterning processes. The width W1 of the fin structures 20 is in a range from about 5 nm to about 40 nm in some embodiments, and is in a range from about 7 nm to about 20 nm in certain embodiments. The height H1 of the fin structures 20 is in a range from about 100 nm to about 300 nm in some embodiments, and is in a range from about 50 nm to 100 nm in other embodiments. When the heights of the fin structures are not uniform, the height from the substrate may be measured from the plane that corresponds to the average heights of the fin structures.

Figure 2:
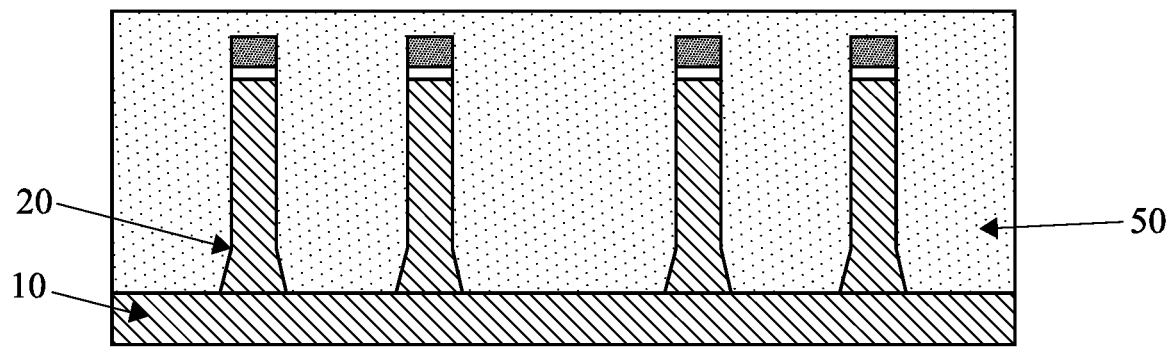

As shown in FIG. 2, an insulating material layer 50 to form an isolation insulating layer is formed over the substrate 10 so as to fully cover the fin structures 20.

The insulating material for the isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The isolation insulating layer 50 may be SOG, SiO, SiON, SiOCN or fluorine-doped silicate glass (FSG). The isolation insulating layer 50 may be doped with boron and/or phosphorous.

Figure 3:
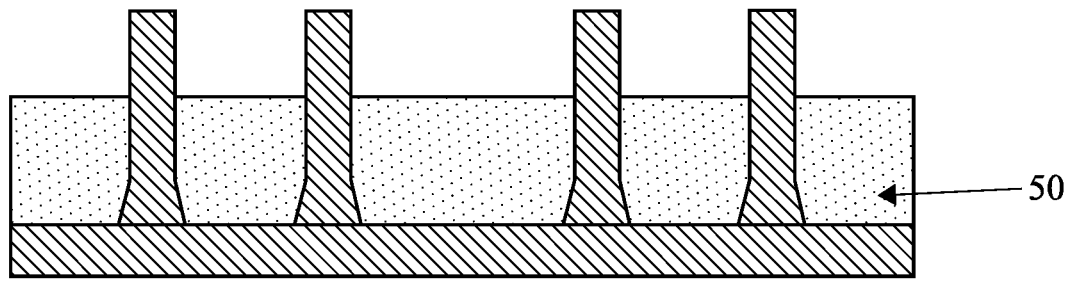

After forming the isolation insulating layer 50, a planarization operation is performed so as to remove upper part of the isolation insulating layer 50 and the mask layer 100 including the pad oxide layer 106 and the silicon nitride mask layer 107. Then, the isolation insulating layer 50 is further removed so that an upper part of the fin structures 20, which is to become a channel region, is exposed, as shown in FIG. 3.

After forming the isolation insulating layer 50, a thermal process, for example, an anneal process, is optionally performed to improve the quality of the isolation insulating layer 50. In certain embodiments, the thermal process is performed by using rapid thermal annealing (RTA) at a temperature in a range from about 900° C. to about 1050° C. for about 1.5 seconds to about 10 seconds in inert gas ambient, for example, $N_2$, Ar or He ambient.

After the upper portions of the fin structures 20 are exposed from the isolation insulating layer 50, a gate insulating layer 105 and a poly silicon layer are formed over the isolation insulating layer 50 and the exposed fin structures 20, and then patterning operations are performed so as to obtain a gate layer 110 made of poly silicon as shown in FIGS. 4A-4D. The gate insulating layer 105 may be silicon oxide formed by CVD, PVD, ALD, e-beam evaporation, or other suitable process. A thickness of the poly silicon layer is in a range from about 5 to about 100 nm in some embodiments. In the gate replacement technology described with this embodiment, the gate insulating layer 105 and gate layer 100 are both dummy layers which are eventually removed.

After the patterning the poly silicon layer, sidewall insulating layers 80 (sidewall spacers) are also formed at both side faces of the gate layer 110. The sidewall insulating layers 80 is made of one or more layers of silicon oxide or silicon nitride based materials such as SiN, SiCN, SiON or SiOCN. In one embodiment, silicon nitride is used.

After the sidewall insulating layers 80 are formed, an insulating layer (not shown) to be used as a contact-etch stop layer (CESL) may optionally formed over the poly silicon layer 110 and the sidewall insulating layer 80. The CESL layer may be made of one or more layers of silicon oxide or silicon nitride based materials such as SiN, SiCN, SiON or SiOCN. In one embodiment, silicon nitride is used.

Further, an interlayer dielectric layer (ILD) 70 is formed in spaces between the gate layers 110 with the side-wall insulating layers 80 (and the CESL, if formed) and over the gate layer 110. The ILD 70 may include silicon oxide, silicon nitride, silicon oxynitride (SiON), SiOCN, fluorine-doped silicate glass (FSG), or a low-K dielectric material, and may be made by CVD or other suitable process. The insulating material for the isolation insulating layer 50 may be the same as or different from that for the ILD 70.

Figure 4A:
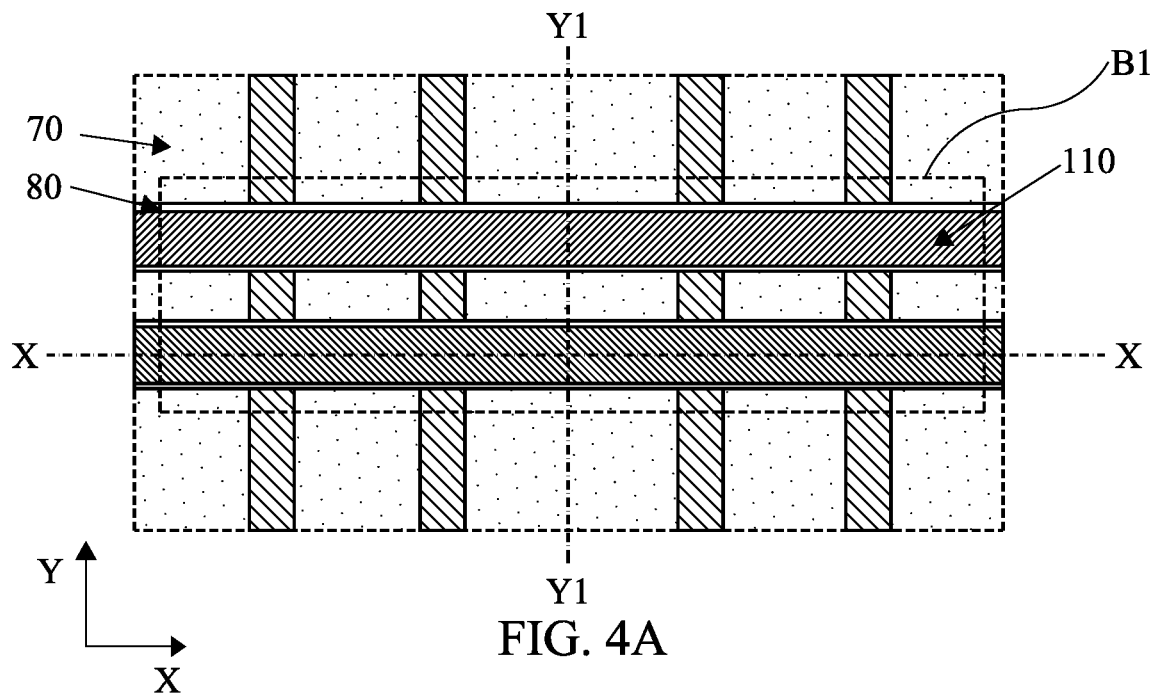
Figure 4B:
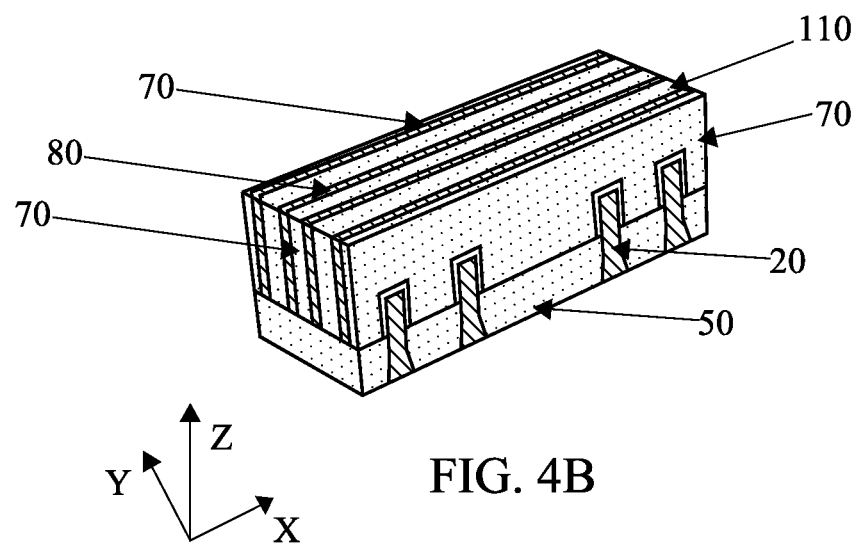
Figure 4C:
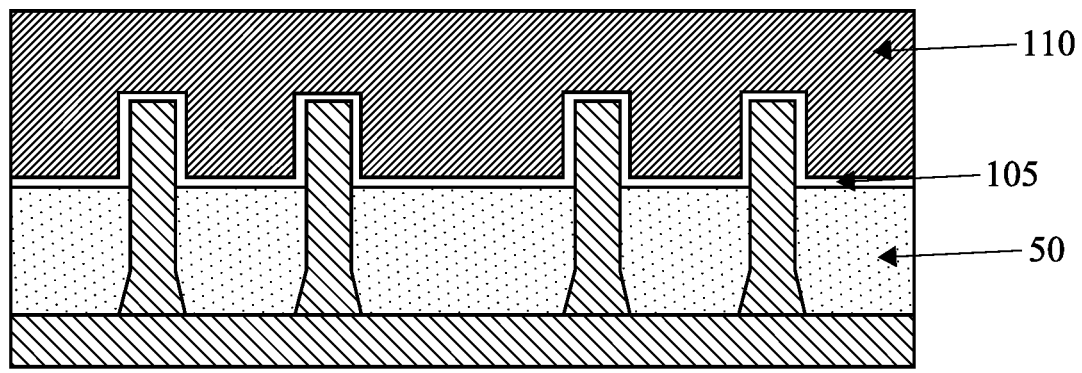
Figure 4D:
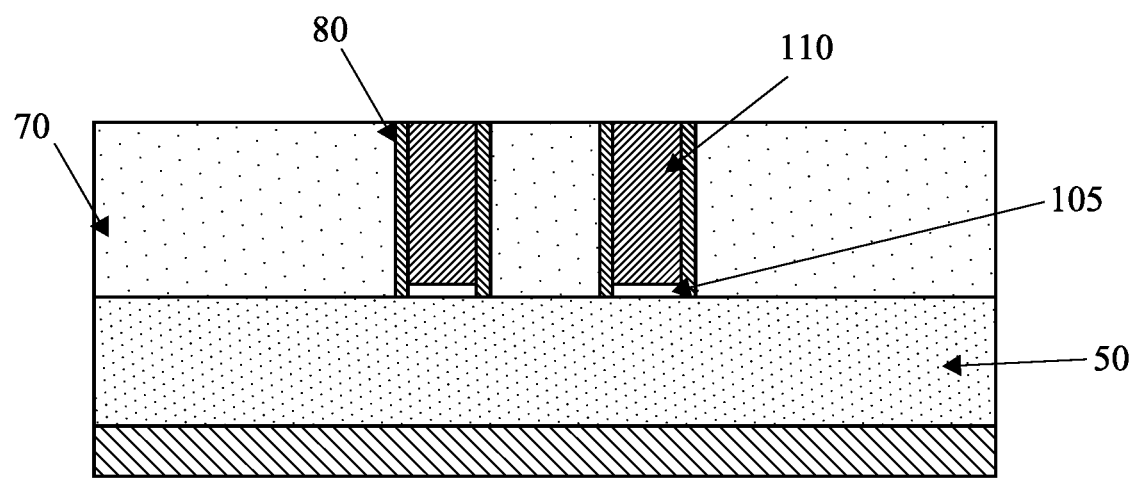

Planarization operations, such as an etch-back process and/or a chemical mechanical polishing (CMP) process, are performed, so as to obtain the structure shown in FIGS. 4A-4D. FIG. 4A is a plan view (top view) and FIG. 4B is a perspective view of the Fin FET device after the gate layer 110 and the interlayer dielectric layer 70 are formed. FIGS. 1-3 and 4C correspond to cross sectional views along line X1-X1 in FIG. 4A, FIG. 4D correspond to a cross sectional view along line Y1-Y1 in FIG. 4A, and FIG. 4B corresponds to the enclosed portion B1 in FIG. 4A.

As shown in FIGS. 4A and 4B, the gate layers 110 are formed in a line-and-space arrangement extending in one direction (X direction) with a constant pitch. The gate layers 110 may include another line-and-space arrangement extending in another direction (Y direction) perpendicular to the one direction, and another line-and-space arrangement with different dimensions.

The gate layers 110 cover the channel regions of the Fin FETs formed with the fin structures 20. In other words, the gate layers 110 are formed over the channel regions. The fin structures not covered by the gate layers will become source/drain regions by appropriate source/drain fabrication operations.

Figure 5A:
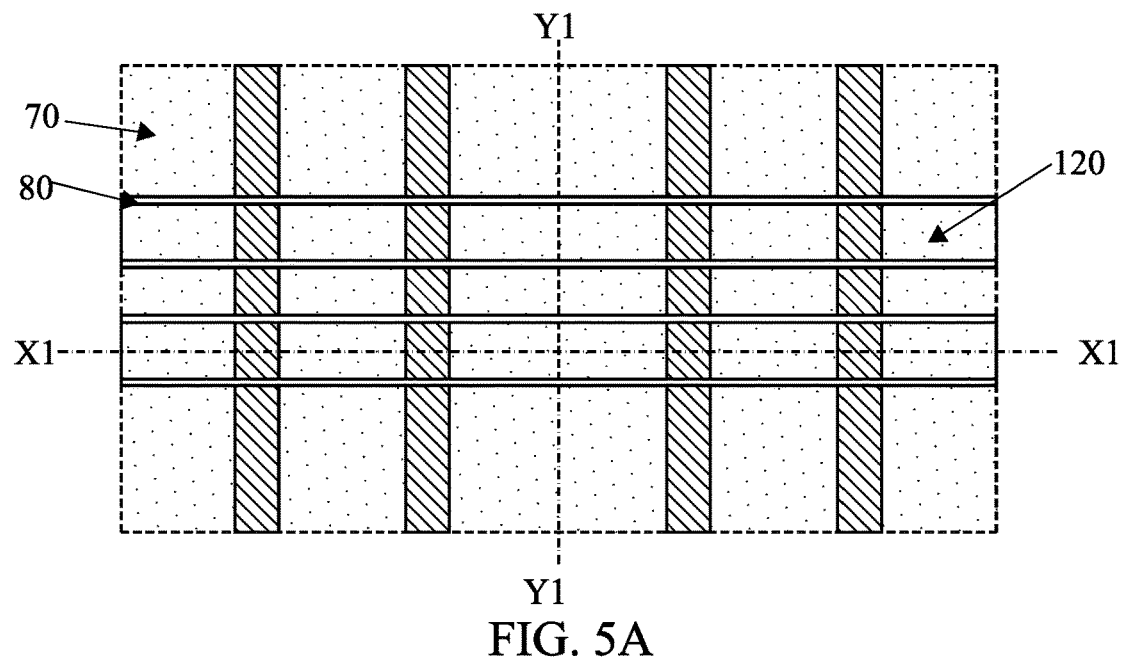
Figure 5B:
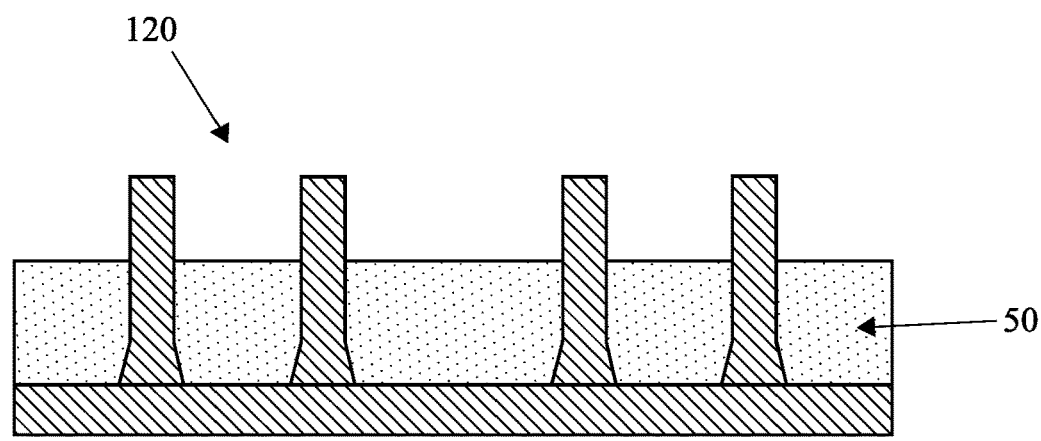
Figure 5C:
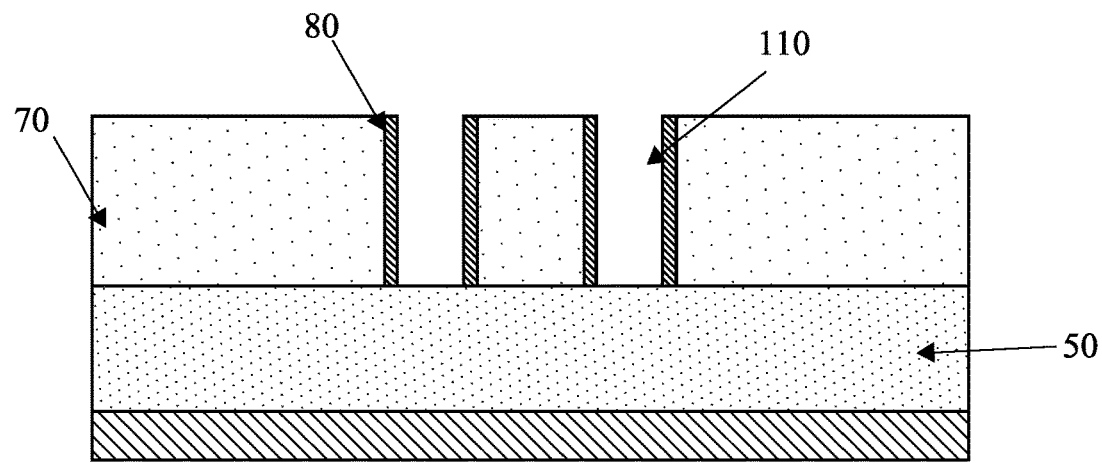

Next, as shown in FIGS. 5A-5C, after the planarization operation to expose the upper surface of the gate layers 110, the gate layers 110 and gate insulating layer 105 (i.e., dummy layers) are removed by using dry etching and/or wet etching, thereby forming gate-line opening 120, as shown in FIG. 5A-5C.

Figure 6A:
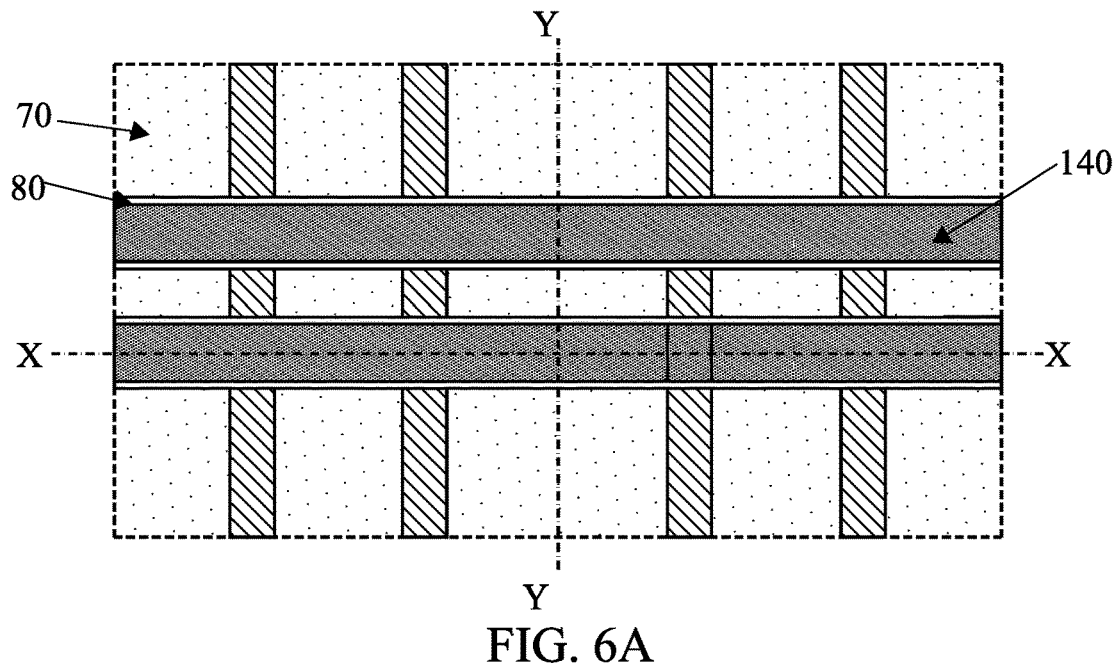
Figure 6B:
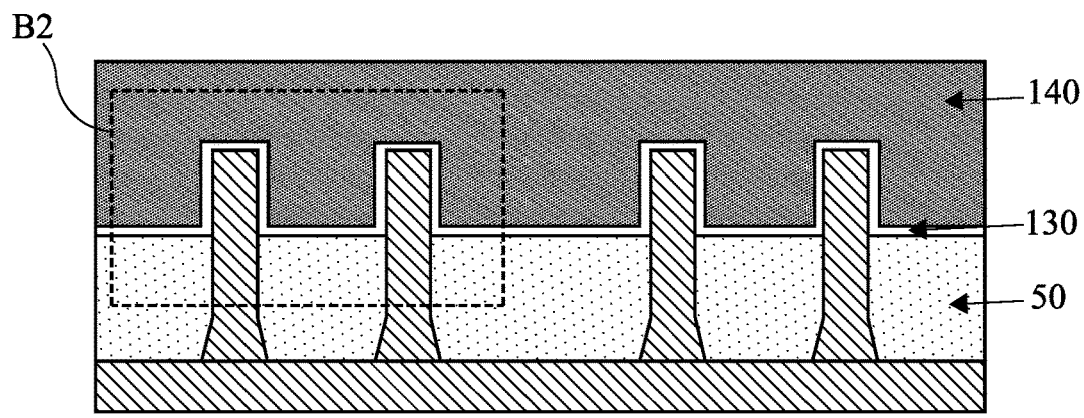
Figure 6C:
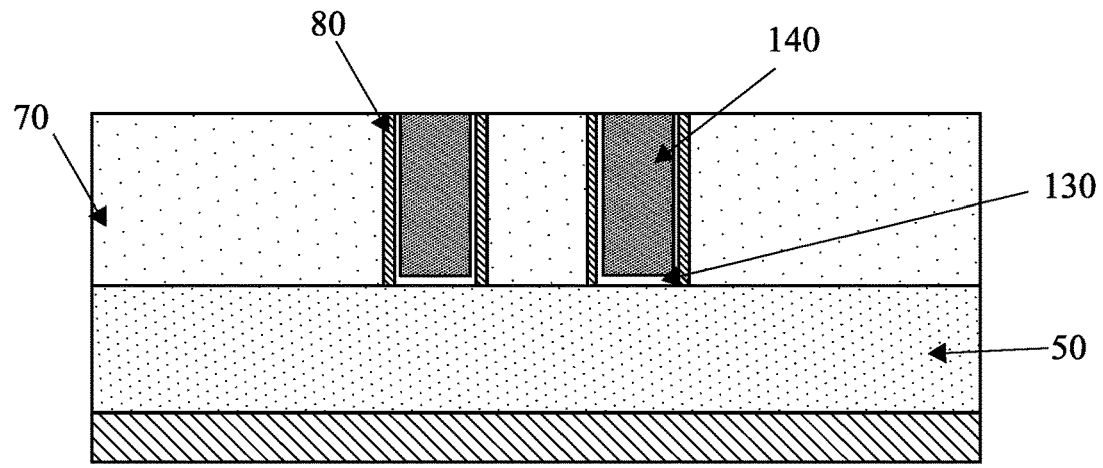
Figure 6D:
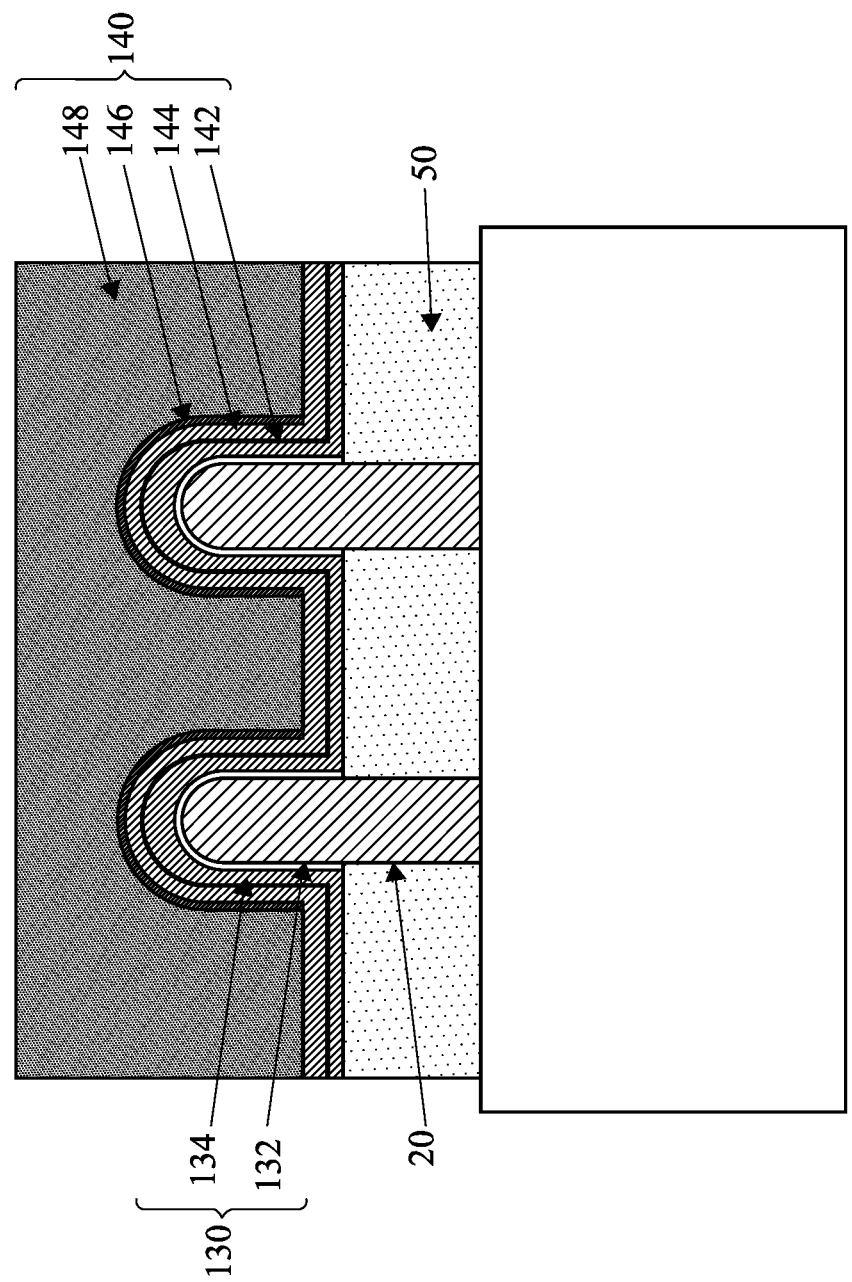

Next, as shown in FIG. 6A-6D, metal gate structures including a gate dielectric layer 130 and a metal gate electrode layer 140 are formed in the gate-line opening 120. FIG. 6D is an enlarged view of the area B2 of FIG. 6B.

In certain embodiments, the gate dielectric layer 130 includes an interfacial layer 132 made of silicon oxide and one or more layers of dielectric material 134, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The interfacial layer 132 is formed by, for example, thermal oxidation of the channel region of the fin structure 20. The dielectric material layer 134 is formed by CVD or ALD over the channel regions of the fin structures and the upper surface of the isolation insulating layer 50.

In certain embodiments, the metal gate electrode layer 140 includes underlying layers such as a barrier layer 142, a work function adjustment layer 144 and a glue (or adhesion) layer 146 and a main metal layer 148, stacked in this order, as shown in FIG. 6D.

Although the top portion of the channel region of the fin structures 20 is illustrated as having a rectangular shape (right angle) for an illustration purpose in FIG. 6B, the top portion of the channel region of the fin structures 20 generally has a round shape as shown in FIG. 6D.

The barrier layer 142 is made of, for example, TiN, TaN, TiAlN, TaCN, TaC or TaSiN. In one embodiment, TaN is used.

The work function adjustment layer 144 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

The glue layer 146 is made of, for example, TiN, TaN, TiAlN, TaCN, TaC or TaSiN. In one embodiment, TiN is used.

The main metal layer 148 includes one or more layer of any suitable metal material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In forming the metal gate structures, the gate dielectric layer 130 and the gate electrode layer 140 are formed by a suitable film forming method, for example, CVD or ALD for gate dielectric layer, and CVD, PVD, ALD or electroplating for the metal layers, and then a planarization operation such as CMP is performed.

Figure 7A:
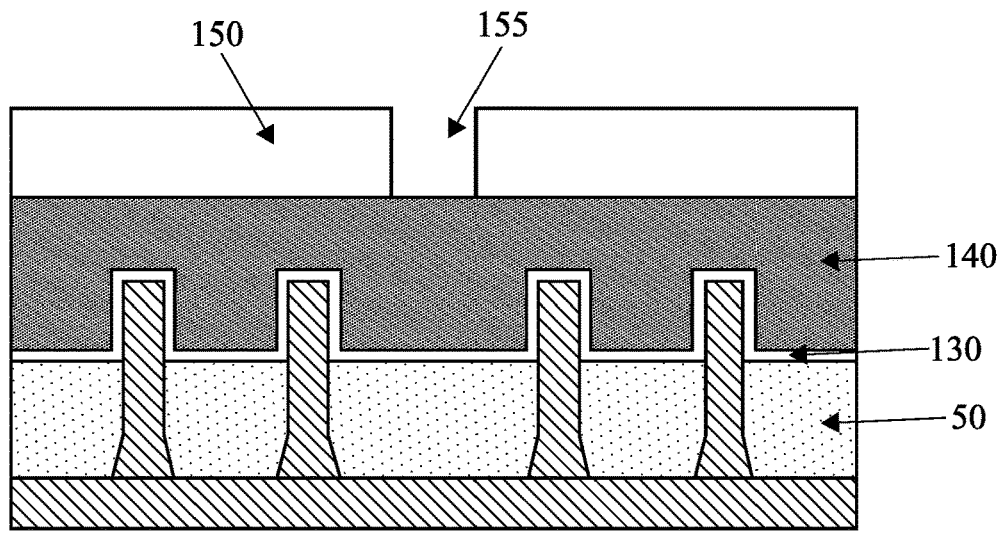
Figure 7B:
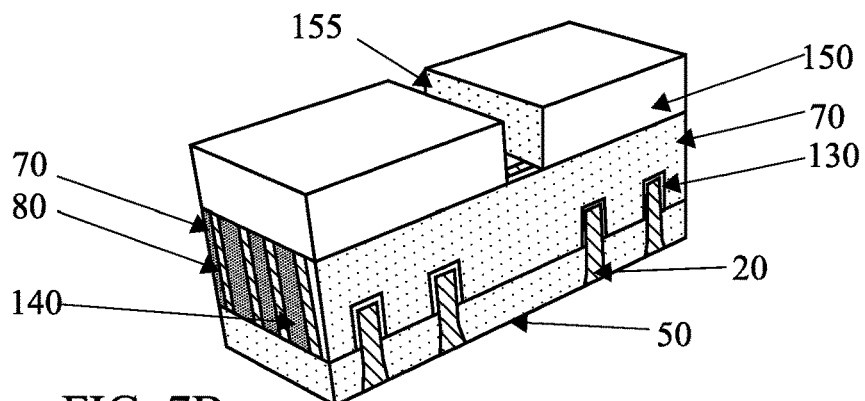
Figure 7C:
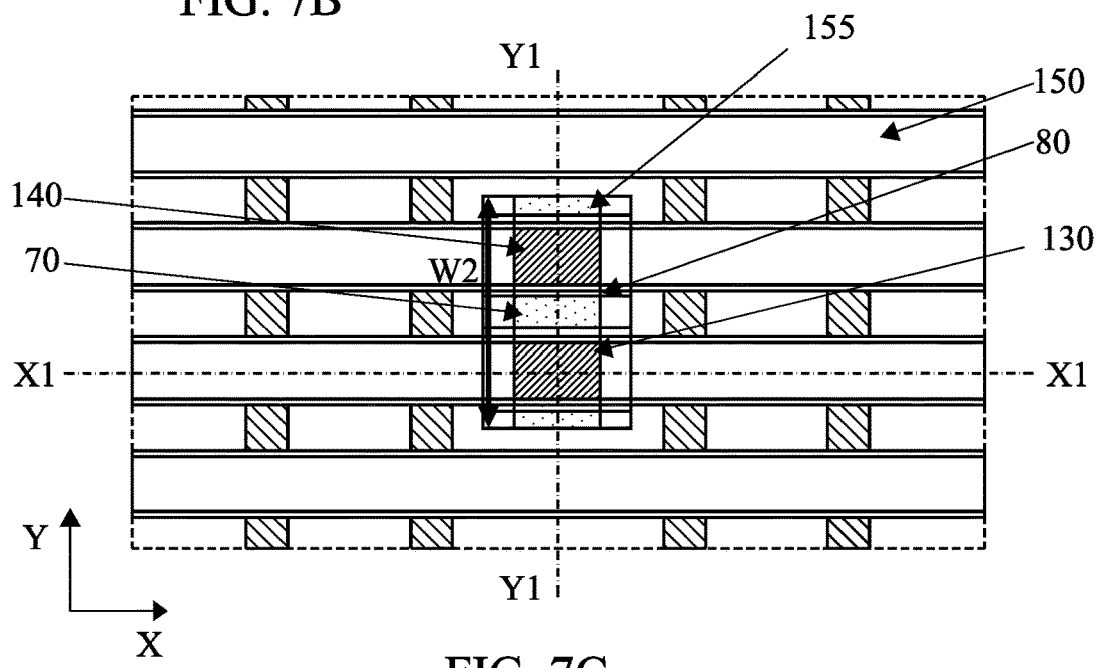

After forming the metal gate structures, a mask pattern 150 is formed over the resultant of FIGS. 6A-6D. FIG. 7A is a cross sectional view corresponding to line X1-X1 in FIG. 7C and FIG. 7B is a perspective view of the area corresponding to the area B1 of FIG. 4A, and FIG. 7C is a top view.

The mask pattern 150 is formed by, for example, a material having a high etching selectivity to metal materials forming the metal gate structure. In one embodiment, the mask pattern 150 is made of silicon oxide or silicon nitride. The mask pattern 150 has an opening 155. A width of the opening 155 along the X direction is in a range from about 5 nm to about 100 nm in some embodiments, and in a range from about 10 nm to 30 nm in other embodiments. The width W2 of the opening 155 along the Y direction is adjusted to expose a desirable number of gate structures. In FIG. 7C, the width W2 of the opening 155 along the Y direction is such a length that two gate structures are exposed in the opening 155, and the edges of the opening in the Y direction are located between the adjacent gate structures over the ILD 70.

Figure 8A:
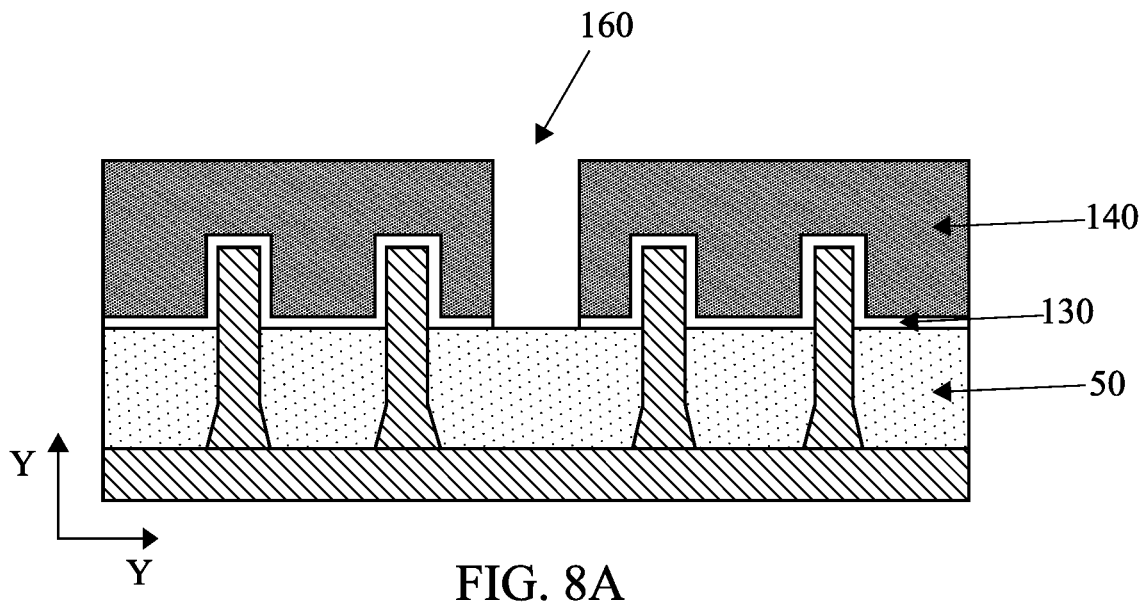
Figure 8B:
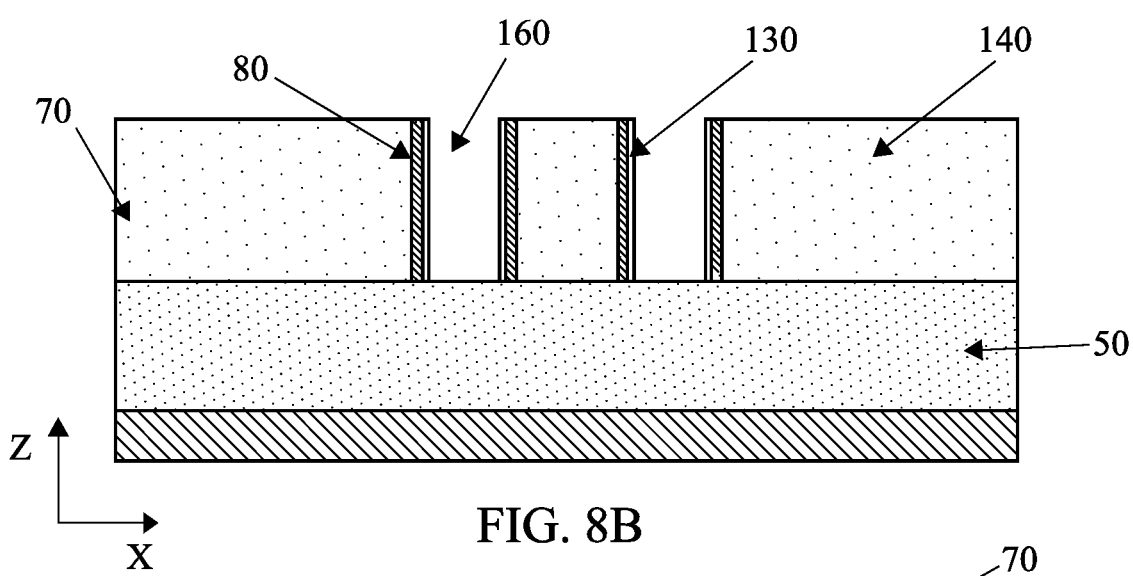
Figure 8C:
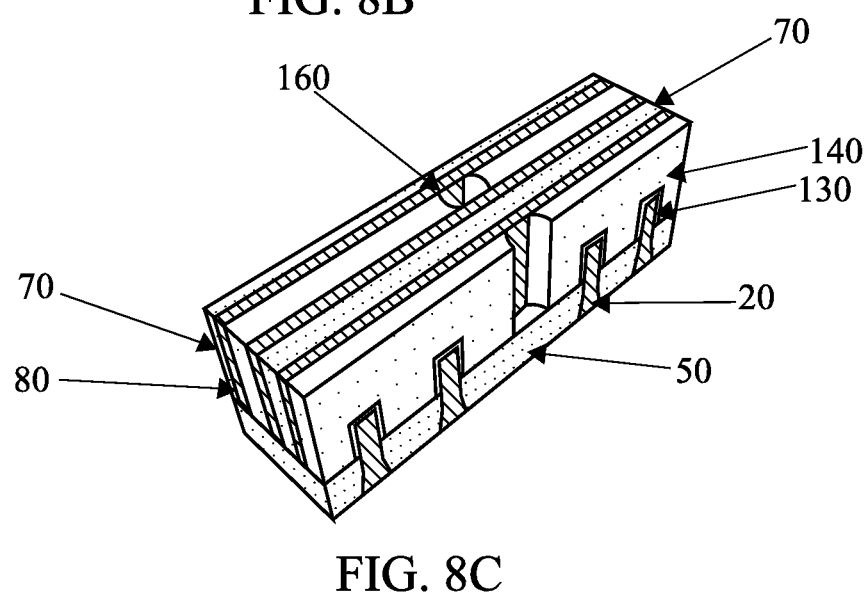

As shown in FIGS. 8A-8C, by using the mask pattern 150 as an etching mask, a part of metal gate layer 140 and the gate dielectric layer 130 are removed, so as to obtain an opening 160 that separates the gate structure. The etching of the gate layer is performed by plasma etching.

As shown in FIG. 8A, along the Y direction, the metal gate electrode layer 140 is exposed in the opening 160, and as shown in FIG. 8B, along the X direction, the opening is formed by the gate dielectric layer 130.

In some embodiment, as shown in FIGS. 8A-8C, the gate dielectric layer 130 is fully removed from the bottom of the opening 160. Further, the gate dielectric layer 130 may also be fully removed in the opening 160 so that no dielectric layer remains in the opening 160. In other embodiments, the gate dielectric layer 130 remains in the bottom of the opening 160.

It is noted that the cross sectional views of the opening 160 has a rectangular shape shown in FIG. 8B, but in some embodiments, the opening 160 has a tapered shape having a larger top size and a smaller bottom size.

Figure 9A:
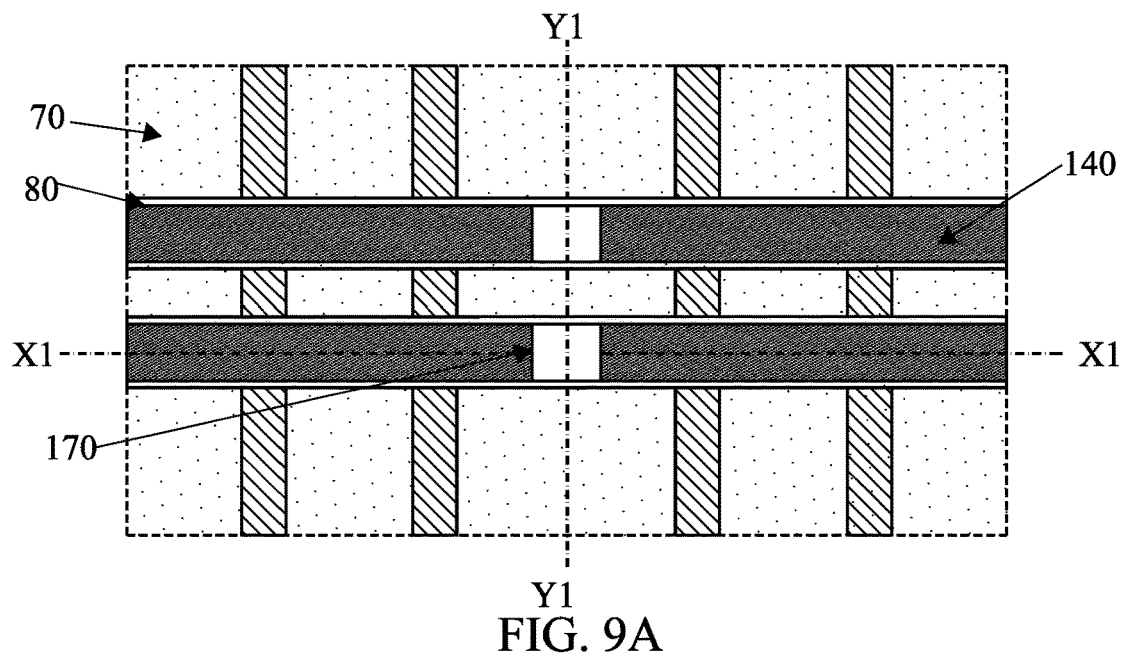
Figure 9B:
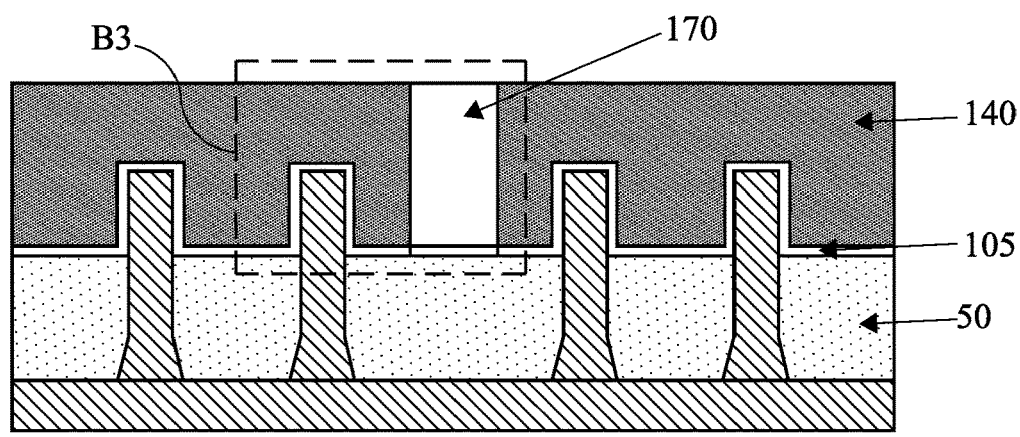
Figure 9C:
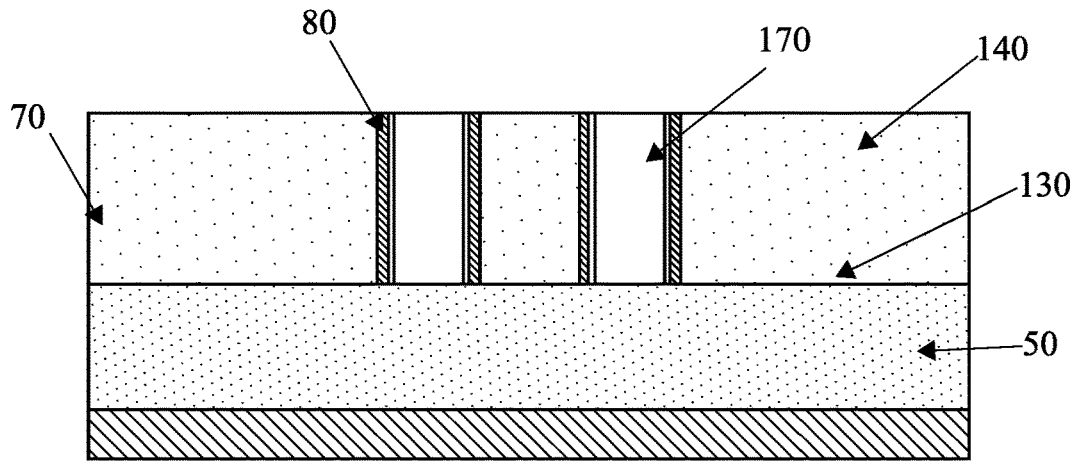
Figure 9D:
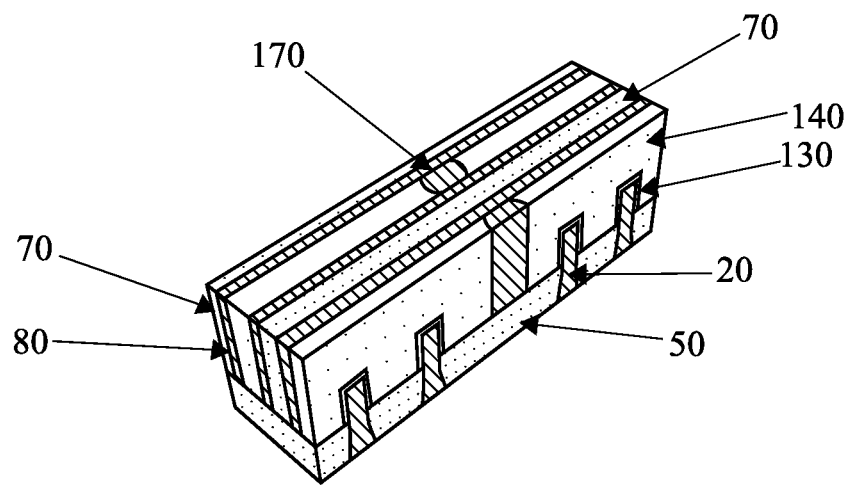
Figure 9E:
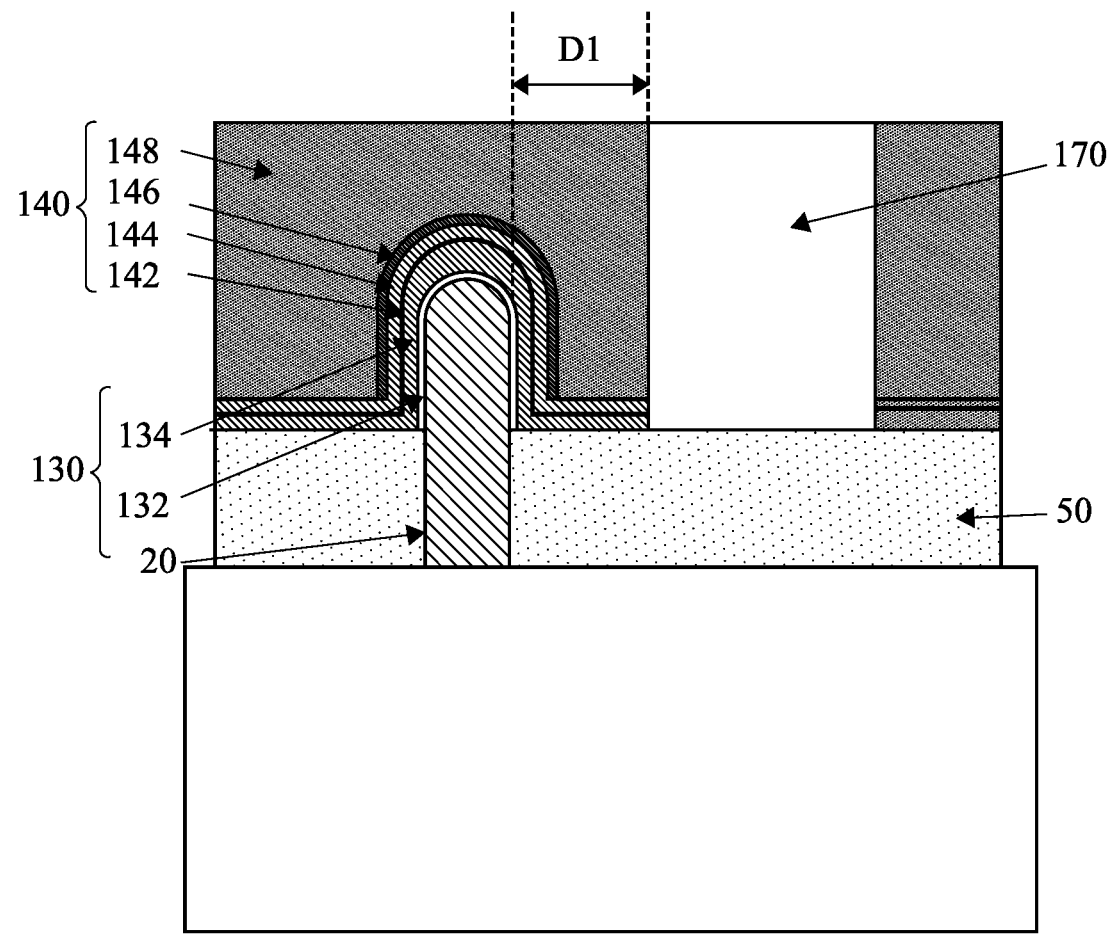

Then, as shown in FIGS. 9A-9E, a separation plug 170 is formed in the opening 160. FIG. 9A is a top view, FIG. 9B is a cross sectional view of line X1-X1 of FIG. 9A, and FIG. 9C is a cross sectional view of line Y1-Y1 of FIG. 9A. FIG. 9D is a perspective view and FIG. 9E is an enlarged view of area B3 of FIG. 9B.

To form the separation plug 170, a blanket layer of an insulating material is filled in the opening 160 and formed over the gate electrode 170 and the ILD 70 by using CVD or ALD, and then a planarization operation such as CMP is performed. In the CMP, the CMP is performed to expose the upper surface of the metal gate electrode layers 140, as shown in FIGS. 9A and 9B. In other words, the metal gate electrode layers 140 function as a stopper for the CMP process. By this planarization operation, a separation plug 170 is formed.

The separation plug 170 is made of, for example, silicon oxide or silicon nitride based material such as SiN, SiON, SiCN or SiOCN.

In the present embodiment, after the gate dielectric layer 130 and the metal gate electrode layer 140 are formed, the opening 160 and the separation plug 170 are formed. Accordingly, as shown in FIG. 9E, the main metal layer 148 is in contact with the side wall of the separation plug. Further, the uppermost portion of the gate dielectric layer 130 along the Y direction is located above the fin structure 20, and the uppermost portions of the underlying layers 142, 144 and 146 of the metal gate electrode layer 140 along the Y direction are also located above the fin structure 20. Along the X direction, the metal gate electrode layer 140 and the gate dielectric layer has the same height.

In the foregoing embodiment, the metal gate structure is separated into two metal gate electrode layers 140 each having the gate dielectric layer 130, as shown in FIGS. 7A-8C. However, in other embodiments, the metal gate structure is separated into more than two gate electrode layers by the patterning operations. In such a case, as shown in FIG. 10A, multiple metal gate structures each including the metal gate electrode layer 140 and the gate dielectric layer 130 are aligned and separated by separation plugs 170.

Further, the metal gate structure has two ends in its longitudinal direction before the separation operation. In some embodiments, the separation plug 170 is formed in at least one of these ends, as shown in area B3 of FIG. 10A. In such a case, the divided gate structure including the metal gate electrode layer 140 and the gate dielectric layer 130 is sandwiched by two separation plugs 170.

Figure 10A:
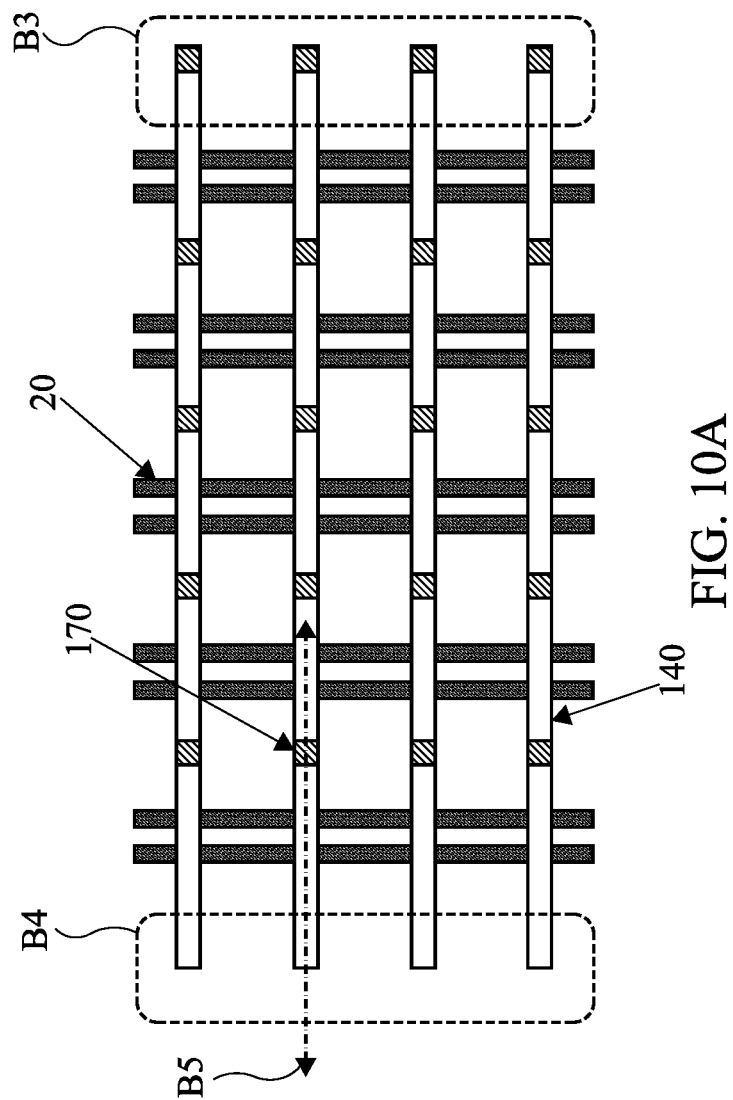
FIGS. 10A and 10B show an exemplary structure of an FET device according to another embodiment of the present disclosure.
Figure 10B:
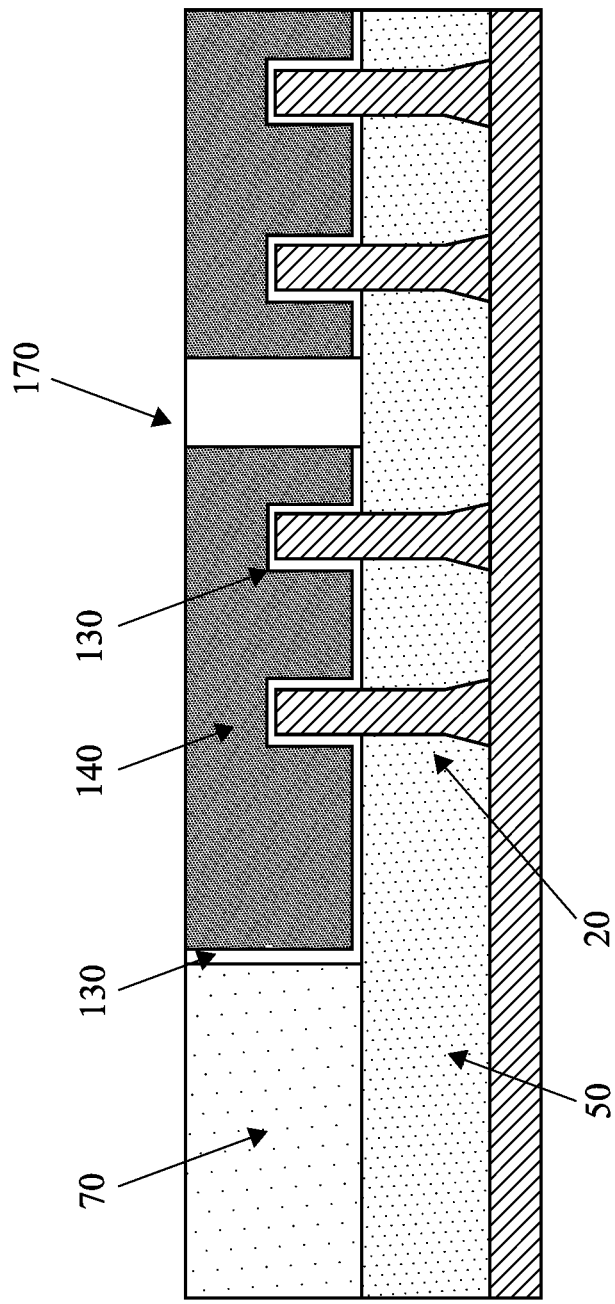

In other embodiments, the separation plug 170 is not formed in at least one of the ends, as shown in area B4 of FIG. 10A. In such a case, one end of the gate structure including the metal gate electrode layer 140 and the gate dielectric layer 130 has a separation plug 170 and the other end of the gate structure has the structure shown in FIG. 10B. FIG. 10B is a cross sectional view of line B5 of FIG. 10A. As shown in FIG. 10B, the gate structure, in particular the gate dielectric layer 130 is in contact with the ILD 70 and the metal gate electrode layer 140, in particular, the main metal gate electrode layer 148, is not in contact with the ILD 70.

If the separation plug is first formed by dividing the dummy gate electrode and filling an opening between the divided dummy gate electrode and then the spaces formed by removing the divided dummy gate electrodes are filled by metal gate materials, the gate dielectric layer and underlying metal layers such as a barrier layer, a work function adjustment layer and a glue layer are formed on the side surface of the separation plug. In such a case, the distance D1 between the separation plug and the fin structure as shown in FIG. 9E cannot be set too small because a smaller distance D1 may prevent the main metal layer 148 from fully filling the space between the separation plug and the fin structure.

In contrast, in the present embodiment, since no gate dielectric layer and no underlying metal layers are formed on the side surface of the separation plug, even if the distance D1 becomes smaller, the main metal layer 148 can fully fill the space between the separation plug 170 and the fin structure 20. Accordingly, it is possible to shrink the semiconductor device.

In another embodiment, a gate insulating layer 105 is not a dummy layer and is made of dielectric material finally used in the FET device. In such a case, a high-k dielectric material described above can be used. When the gate insulating layer 105 is not a dummy layer, the gate dielectric layer 130 is not deposited before forming the metal gate electrode layer 140.

It is understood that the structure shown in FIGS. 9A-9E undergoes further CMOS processes to form various features such as interconnect vias, interconnect metal layers, passivation layers, etc.

Figure 11A:
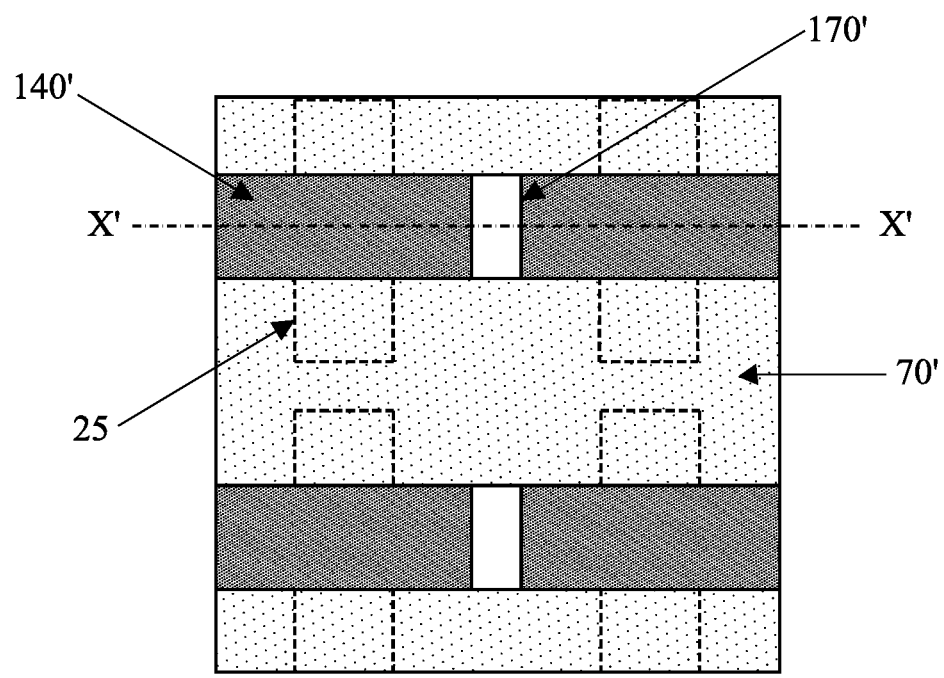
FIGS. 11A and 11B show an exemplary structure of an FET device according to one embodiment of the present disclosure.
Figure 11B:
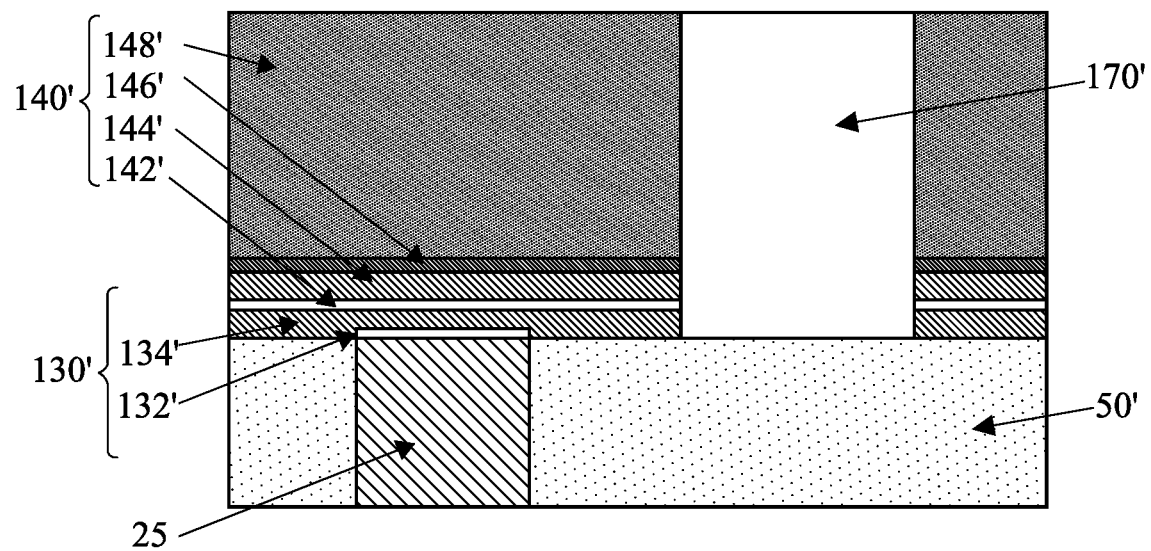

In the above embodiments, a Fin FET is employed. However, the foregoing technologies can be applied to a planar type FET, as shown in FIGS. 11A and 11B. As shown in FIGS. 11A and 11B, the FET includes a channel region 25 of a semiconductor substrate and a gate structure including a gate dielectric layer 130' formed over the channel region 25 and a metal gate electrode layer 140' formed over the gate dielectric layer 130'. The gate dielectric layer 130' includes an interfacial layer 132' and one or more layers of dielectric material 134', similar to the gate dielectric layer 130. The metal gate electrode layer 140' includes a barrier layer 142', a work function adjustment layer 144', a glue (or adhesion) layer 146' and a main metal layer 148', stacked in this order, similar to the metal gate electrode layer 140. The channel regions are separated by the isolation insulating layers 50 and two gate structures are separated by a separation plug 170.

The various embodiments or examples described herein offer several advantages over the existing art. For example, since no gate dielectric layer and no underlying metal layers are formed on the side surface of the separation plug, the width in the Y direction of the gate space to be filled by metal gate materials can become larger. With the enlarged gate opening, the metal gate materials such as a metal gate electrode material can be fully filled in the opening without forming voids. In turn, this makes the distance between the separation plug and the fin structure smaller, and it is possible to shrink the semiconductor device.

It will be understood that not all advantages have been necessarily discussed herein, no particular advantage is required for all embodiments or examples, and other embodiments or examples may offer different advantages.

In accordance with one aspect of the present disclosure, a semiconductor device includes a first fin field-effect transistor (Fin FET) and a second Fin FET. The first Fin FET includes a first fin structure extending in a first direction and a first gate structure. The first gate structure includes a first gate dielectric layer formed over the first fin structure and a first gate electrode layer formed over the first gate dielectric layer, and extends in a second direction perpendicular to the first direction. The second Fin FET includes a second fin structure extending in the first direction and a second gate structure. The second gate structure includes a second gate dielectric layer formed over the second fin structure and a second gate electrode formed over the second gate dielectric layer, and extends in the second direction. The first gate structure and the second gate structure are aligned along the second direction. The first gate structure and the second gate structure are separated by a separation plug made of an insulating material. The first gate electrode layer is in contact with a side wall of the separation plug.

In accordance with another aspect of the present disclosure, a semiconductor device includes a first field-effect transistor (FET) and a second FET. The first FET includes a first channel region of a semiconductor substrate and a first gate structure. The first gate structure includes a first gate dielectric layer formed over the first channel region and a first gate electrode layer formed over the first gate dielectric layer, and extends in a first direction. The second FET includes a second channel region of the semiconductor substrate and a second gate structure. The second gate structure includes a second gate dielectric layer formed over the second channel region and a second gate electrode layer formed over the second gate dielectric layer, and extends in the first direction. The first gate structure and the second gate structure are aligned along the first direction. The first gate structure and the second gate structure are separated by a separation plug made of an insulating material. The first gate electrode layer is in contact with a side wall of the separation plug.

In accordance with another aspect of the present disclosure, a method for manufacturing a semiconductor device includes forming a dummy gate structure over channel regions formed over a substrate. The dummy gate structure includes a dummy gate electrode layer. Interlayer dielectric layers are formed at both sides of the dummy gate structure. After forming the interlayer dielectric layers, the dummy gate electrode layer is removed, so that an electrode space is formed. A gate structure is formed in the electrode space. The gate structure includes a gate electrode layer. The gate structure is patterned so that the gate structure is divided into at least two divided gate structures including a first gate structure and a second gate structure separated by an opening. A separation plug is formed by filling the opening with an insulating material. The gate electrode layer in the first gate structure is in contact with a side wall of the separation plug.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin field-effect transistor (Fin FET) including a first fin structure extending in a first direction and a first gate structure, the first gate structure including a first gate dielectric layer formed over the first fin structure and a first gate electrode layer formed over the first gate dielectric layer and extending in a second direction perpendicular to the first direction;
a second Fin FET including a second fin structure extending in the first direction and a second gate structure, the second gate structure including a second gate dielectric layer formed over the second fin structure and a second gate electrode layer formed over the second gate dielectric layer and extending in the second direction; and
an interlayer dielectric layer covering sides of the first and second gate structures, wherein:
the first gate structure and the second gate structure are aligned along the second direction,
the first gate structure and the second gate structure are separated by a separation plug made of an insulating material,
a first end of the first gate electrode layer is in contact with a side wall of the separation plug without interposing the first gate dielectric layer therebetween, and
a second end of the first gate electrode layer opposite to the first end is separated from the interlayer dielectric layer by the first gate dielectric layer and is not in contact with the interlayer dielectric layer.

2. The semiconductor device of claim 1, wherein:
the first gate electrode layer includes underlying layers and a main metal electrode layer formed over the first fin structure, and
the main metal electrode layer is in contact with the side wall of the separation plug.

3. The semiconductor device of claim 1, the separation plug is made of a different material than the interlayer dielectric layer.

4. The semiconductor device of claim 3, wherein the separation plug is made of a silicon nitride based material.

5. The semiconductor device of claim 1, wherein an uppermost portion of the first gate dielectric layer along the second direction is located above the first fin structure.

6. The semiconductor device of claim 1, wherein:
the second gate electrode layer includes underlying layers and a main metal electrode layer formed over the second fin structure, and
the main metal electrode layer of the second gate electrode layer is in contact with a side wall of the separation plug.

7. The semiconductor device of claim 6, wherein uppermost portions of the underlying layers along the second direction are located above the first fin structure.

8. The semiconductor device of claim 1, wherein:
the second gate structure has a first end and a second end,
the separation plug is provided at the first end of the second gate structure, and
another separation plug is provided at the second end of the second gate structure.

9. A semiconductor device, comprising:
a field effect transistor (FET) including a channel region of a semiconductor substrate and a gate structure, the gate structure including a gate dielectric layer formed over the channel region and a gate electrode layer formed over the gate dielectric layer and extending in a first direction;
a first insulating layer disposed at a first end of the gate structure along the first direction; and
a second insulating layer disposed at a second end of the gate structure opposite to the first end along the first direction, wherein:
in a cross section along the first direction, at the first end, the gate electrode layer is in contact with a side wall of the first insulating layer without interposing the gate dielectric layer therebetween, and at the second end, the gate electrode layer is separated by the gate dielectric layer and is not in contact with a side wall of the second insulating layer.

10. The semiconductor device of claim 9, wherein the first insulating layer is made of a different material than the second insulating layer.

11. The semiconductor device of claim 10, wherein the first insulating layer is made of SiN.

12. The semiconductor device of claim 9, wherein:
the gate electrode layer includes underlying layers and a main metal electrode layer formed over the channel region, and
the main metal electrode layer is in contact the side wall of the first insulating layer.

13. The semiconductor device of claim 9, further comprising a fin structure having the channel region.

14. The semiconductor device of claim 8, further comprising fin structures, each of which has the channel region, wherein the gate structure is disposed over the fin structures.

15. A semiconductor device, comprising:
a first field effect transistor (FET) including a first channel region of made of a semiconductor material and a first gate structure, the first gate structure including, a first gate dielectric layer formed over the first channel region, a first gate electrode layer formed over the first gate dielectric layer, and sidewall spacers; and
an insulating plug made of a single layer of an insulating material,
wherein the first gate electrode layer of the first gate structure is in contact with the insulating plug and the insulating plug is in contact with at least one of the sidewall spacers, and
the insulating plug has a curved portion convex toward the first gate electrode in plan view.

16. The semiconductor device of claim 15, further comprising:
a second FET including a second channel region of made of a semiconductor material and a second gate structure, the second gate structure including, a second gate dielectric layer formed over the second channel region, a second gate electrode layer formed over the second gate dielectric layer, and the sidewall spacers,
wherein the sidewall spacers are continuous between the first FET and the second FET.

17. The semiconductor device of claim 16, wherein the insulating plug is in contact with the second gate electrode layer of the second gate structure.

18. The semiconductor device of claim 15, further comprising: an interlayer dielectric layer adjacent to the sidewall spacers.

19. The semiconductor device of claim 18, wherein the insulating plug is made of a different material than the interlayer dielectric layer.

20. The semiconductor device of claim 19, wherein the insulating plug is made of silicon nitride.

* * * * *